US 6,692,892 B1

(12) United States Patent
Takano et al.

(10) Patent No.: US 6,692,892 B1
(45) Date of Patent: Feb. 17, 2004

(54) COMPOSITION FOR ANTIREFLECTION COATING

(75) Inventors: Yusuke Takano, Shizuoka (JP); Hatsuyuki Tanaka, Shizuoka (JP); Dong Han Lee, Ansung (KR)

(73) Assignee: Clariant Finance (BVI) Limited (VG)

( * ) Notice: Subject to any disclaimer, the term of this patent is extended or adjusted under 35 U.S.C. 154(b) by 197 days.

(21) Appl. No.: 09/889,184

(22) PCT Filed: Aug. 11, 2000

(86) PCT No.: PCT/JP00/07851

§ 371 (c)(1), (2), (4) Date: Jul. 10, 2001

(87) PCT Pub. No.: WO01/35167

PCT Pub. Date: May 17, 2001

(30) Foreign Application Priority Data

Nov. 10, 1999 (JP) ............................. 11-319888

(51) Int. Cl.$^7$ .............................. G03F 7/00; G09D 5/33
(52) U.S. Cl. ............................... 430/270.1; 430/273.1; 430/290; 430/322; 430/950; 106/287.23
(58) Field of Search .......................... 430/270.1, 273.1, 430/290, 322, 950; 106/287.23

(56) References Cited

U.S. PATENT DOCUMENTS

| 5,457,153 A |   | 10/1995 | Hagiwara et al. ............ 524/462 |
| 5,529,888 A |   | 6/1996 | Watanabe et al. ............ 430/331 |
| 5,541,037 A | * | 7/1996 | Hatakeyama et al. .... 430/273.1 |
| 5,554,489 A |   | 9/1996 | Ishibashi et al. ............ 430/326 |
| 5,611,850 A | * | 3/1997 | Nishi et al. ............ 106/287.26 |
| 5,631,314 A |   | 5/1997 | Wakiya et al. ............... 524/165 |
| 5,744,537 A | * | 4/1998 | Brunsvold et al. .......... 524/520 |
| 5,830,990 A | * | 11/1998 | Rahman ..................... 528/482 |
| 5,853,471 A | * | 12/1998 | Yoshida et al. ........ 106/287.13 |
| 6,132,928 A | * | 10/2000 | Tanabe et al. ........... 430/270.1 |
| 6,309,789 B1 | * | 10/2001 | Takano et al. ........... 430/270.1 |

FOREIGN PATENT DOCUMENTS

| EP | 0 522 990 | 1/1993 |
| JP | 5-188598 | 1/1993 |

OTHER PUBLICATIONS

International Search Report, PCT/JP00/07851/, Mailing Date: Feb. 6, 2000.
English Translation of the Abstract Of JP 5–188598.
English Translation of the Abstract Of JP 6–69120.
English Translation of the Abstract Of JP 7–295210.
English Translation of the Abstract Of JP–9090615.

* cited by examiner

*Primary Examiner*—Mark F. Huff
*Assistant Examiner*—Nicole Barreca
(74) *Attorney, Agent, or Firm*—Alan P. Kass

(57) ABSTRACT

A resist pattern having a good form without any T-top or round top is obtained by coating on a photoresist layer an anti-reflective coating composition containing at least (a) polyacrylic acid, (b) polyvinyl pyrrolidone, (c) $C_nF_{2n+1}COOOH$ (wherein n represents an integer of 3 to 11) and (d) tetramethylammonium hydroxide to form an anti-reflective coating, and conducting patternwise exposure and development.

6 Claims, No Drawings

COMPOSITION FOR ANTIREFLECTION COATING

TECHNICAL FIELD

This invention relates to an anti-reflective coating composition and, more particularly, to an anti-reflective coating composition which prevents reflection of incident light and substrate-reflected light at the surface of a resist upon formation of a pattern by photolithography technique, and to a method of forming a pattern using this anti-reflective coating composition.

BACKGROUND ART

In the field of manufacturing semiconductor elements, there has been applied lithography technique in which a photoresist coating is formed on a substrate such as silicon wafer and, after selectively exposing this with actinic rays, development processing is conducted to form a resist pattern on the substrate.

In recent years, miniaturization of processing size in the lithography process has rapidly been developed for attaining higher integration degree in the field of LSI. In the miniaturization of processing size, there have been made various proposals in all respects such as an exposing apparatus, a photoresist, an anti-reflective coating, etc.

Use of short and single wavelength radiation upon exposure such as in an i-line exposure process at present being widely used causes mutual interference of incident light, reflected light from the photoresist/substrate interface and re-reflected light of this reflected light at the photoresist/air interface within the photoresist layer. The mutual interference causes a problem of standing wave or phenomenon of multiple reflection due to change of substantial exposure amount within the photoresist layer to adversely affect form of a formed resist pattern. As the result, in a line pattern-forming process, there can result insufficient uniformity of line width of a resist pattern or, in a process of forming contact holes on a stepped substrate, there can result opening failure due to difference in substantial optimal sensitivity since the resist layer is not uniform in thickness.

In order to solve the problem described above, a process has conventionally been proposed in which an anti-reflective coating is formed on a photoresist layer, and various anti-reflective coating compositions for use in this anti-reflective coating have also been proposed. For example, Japanese Unexamined Patent Publication No. H05-188598, an anti-reflective coating composition containing a water-soluble polymer binder and a functional fluorocarbon compound to be coated on a photoresist layer is disclosed. In these processes wherein photoresist for i-line and an anti-reflective coating are used, resulting resist patterns sometimes form T-top to some extent depending upon formulation of the photoresist, temperature of heating treatment, etc., which is becoming a problem.

On the other hand, there have been proposed and partly being put into practice processes of using a short wavelength radiation source effective for forming a much finer pattern, such as a process of using deep-UV rays such as KrF excimer laser (248 nm), ArF excimer laser (193 nm) or the like or even X-rays or electron beams as the exposure radiation source. In the process of using these short wavelength radiation sources, chemically amplified resists are proposed as preferable photoresists.

In the case of using such chemically amplified resist as the photoresist, an anti-reflective coating composition proposed, for example, in the above-mentioned Japanese Unexamined Patent Publication No. H05-188598 tends to cause intermixture of the components in the anti-reflective coating composition and the photoresist, which results in formation of T-top with positive-working resists or formation of round top with negative-working resists. Japanese Unexamined Patent Publication No. H06-69120 discloses to coat an anti-reflective coating composition having been adjusted to alkaline on a resist containing a novolak resin and a naphthoquinonediazide compound, to thereby cause crosslinking reaction in the photoresist layer with the alkali contained in the anti-reflective coating composition being a catalyst. As the result, surface of the photoresist layer is made so slightly soluble that there can be obtained a good pattern suffering less loss of the layer. However, this process involves a problem that it can be applied only to a positive-working resist containing novolak resin and naphthoquinonediazide.

In view of these circumstances, an object of the present invention is to provide an anti-reflective coating composition which does not cause the above-described problems with conventional anti-reflective coating compositions, that is, which never suffers deterioration of pattern form, particularly formation of T-top with chemically amplified positive-working resists or formation of round top with negative-working resists, to be caused by intermixing of the components of the composition and the photoresist.

Another object of the present invention is to provide a method for forming a resist pattern which enables one to form a resist pattern with excellent profile even when an anti-reflective coating is formed by coating on a photoresist layer.

DISCLOSURE OF THE INVENTION

As a result of intensive investigations, the inventors have found that the above-described objects can be attained by using, as an anti-reflective coating composition to be coated on a photoresist layer, a composition which comprises at least the following (a), (b), (c) and (d), thus having achieved the present invention based on the finding.

That is, the present invention relates to an anti-reflective coating composition which comprises at least the following (a), (b), (c) and (d):

(a) polyacrylic acid;

(b) polyvinyl pyrrolidone;

(c) $C_nF_{2n+1}COOH$ (wherein n represents an integer of 3 to 11); and (d) tetramethylammonium hydroxide.

The present invention also relates to a method for forming a resist pattern, which comprises coating the above-described anti-reflective coating composition onto a photoresist layer.

The present invention is now described in more detail below.

Firstly, water-soluble resin of polyacrylic acid to be used in the present invention as component (a) preferably has a molecular weight of 1,000 to 4,000,000 as determined by polystyrene standards, and water-soluble resin of polyvinyl pyrrolidone to be used as component (b) preferably 1,000 to 360,000. Ratio of acrylic acid (a) to polyvinyl pyrrolidone (b), i.e., (a):(b) is preferably 99.5:0.5 to 50:50 (by weight; hereinafter the same unless otherwise specified), more preferably 95:5 to 88:12. The polyacrylic acid component and the polyvinyl pyrrolidone component may be previously mixed, if necessary, to be used as a mixture.

Secondly, perfluoroalkylcarboxylic acid to be used in the present invention as component (c) may be any of those that contain 3 to 11 carbon atoms in the perfluoroalkyl group. They may be used independently or as a mixture of two or more of them. As the perfluoroalkylcarboxylic acid to be used in the present invention, perfluoro-octanoic acid is particularly preferred.

Further, in the anti-reflective coating composition of the present invention, proportion of the water-soluble resins of polyacrylic acid (a) and polyvinyl pyrrolidone (b), perfluoroalkylcarboxylic acid (c) and tetramethylammonium hydroxide, i.e., [(a)+(b)]:(c):(d), is preferablyl 1.0:1.0–7.0:0.1–1.0.

Various additives may optionally be compounded in the anti-reflective coating composition of the present invention within the range of not damaging the properties of the composition. As one of such additives, there is a surfactant to be added for the purpose of improving coating properties or the like. Specific examples of the surfactant include nonionic surfactants such as polyoxyethylene alkyl ether, polyoxyethylene lauryl ether, polyoxyethylene oleyl ether, polyoxyethylene cetyl ether, polyoxyethylene fatty acid diester, polyoxyethylene fatty acid monoester, polyoxyethylene polyoxypropylene block polymer, acetylene glycol and the derivatives thereof, etc.; anionic surfactants such as alkyldiphenyl ether disulfonic acid and the ammonium or organic amine salts thereof, alkyldiphenyl ether sulfonic acid and the ammonium or organic amine salt thereof, alkylbenzenesulfonic acid and the ammonium or organic amine salt thereof, polyoxyethylene alkyl ether sulfulic acid and the ammonium or organic amine salt thereof, alkylsufulic acid and the ammonium or organic amine salt thereof, etc.; and amphoteric surfactants such as 2-alkyl-N-carboxymethyl-N-hydroxyethylimidazolinium betaine, lauric acid amide propylhydroxysulfon betaine, etc.

The components of the anti-reflective coating composition of the present invention are dissolved in water to prepare the anti-reflective coating composition. Water to be used in the anti-reflective coating composition of the present invention is not particularly limited as long as it is water, but water from which organic impurities, metallic ions, etc. have been removed by distillation, ion-exchange treatment, filter treatment, various adsorption treatment, etc. is preferred.

Additionally, in the anti-reflective coating composition of the present invention may be used a water-soluble organic solvent together with water in order to improve coating properties. As such water-soluble organic solvent, any solvent that is soluble in water may be used with no particular limits, and examples thereof include alcohols such as methyl alcohol, ethyl alcohol, isopropyl alcohol, etc.; ketones such as acetone, methyl ethyl ketone, etc.; esters such as methyl acetate, ethyl acetate, etc.; and polar solvents such as dimethylformamide, dimethylsulfoxide, methylcellosolve, cellosolve, butylcellosolve, cellosolve acetate, butylcarbitol, carbitol acetate, etc. These specific examples are illustrated as mere examples of the organic solvents and should not be construed to limit the organic solvents that can be used in the present invention.

The anti-reflective coating composition of the present invention is coated on a photoresist layer by a conventionally known method such as spin coating. Refractive index ($n_a$) of the anti-reflective coating formed by such coating method is preferably a square root of the refractive index of the resist layer ($n_r$), and thickness of the anti-reflective coating is preferably an odd number of times as much as the value of $\lambda_e/4n_a$ wherein $\lambda_e$ represents wavelength of the exposing radiation. In the present invention, the anti-reflective coating is formed on the resist layer by using the above-described anti-reflective coating composition, and then exposure and development are conducted in the conventional manner to form a resist pattern. As the photoresist to which the anti-reflective coating composition of the present invention is applied, any of those that have conventionally been known may be used, with chemically amplified resists being preferable.

BEST MODE FOR PRACTICING THE INVENTION

The present invention will now be described more specifically by reference to Examples which, however, are not to be construed to limit the present invention in any way.

EXAMPLE 1

1.4 parts by weight of a mixture of polyacrylic acid having a weight average molecular weight of 3,000 as determined by polystyrene standards and polyvinyl pyrrolidone having a weight average molecular weight of 45,000 (mixing ratio=90:10), 2.6 parts by weight of $C_7F_{15}COOH$ and 0.6 part by weight of tetramethylammonium hydroxide (TMAH) were uniformly dissolved in 95.4 parts by weight of pure water at room temperature, and the solution was filtered through a 0.05-$\mu$m filter to obtain an anti-reflective coating composition.

On the other hand, a negative-working photoresist having the following formulation was coated on a 4-inch, HMDS-treated silicon wafer using a spin coater, LARC ULTIMA-1000 made by Lithotec Japan Co., then pre-baked on a hot plate at 100° C. for 60 seconds to form a 1-$\mu$m thick resist layer on the HMDS-treated silicon wafer. Thickness of the resist layer was measured using a LAMBDA ACE film thickness-measuring apparatus, made by Dai-nippon Screen Co., Ltd. Then, the above-described anti-reflective coating composition was coated on the photoresist layer using the same spin coater as described above, then pre-baked on a hot plate at 90° C. for 60 seconds to form a 640-Å thick anti-reflective coating. This silicon wafer was exposed through reticle patterns of various line-and-space sizes with stepwise changing the exposure amount using a stepper having an exposing wavelength of i-line (365 nm) (made by Hitachi, Ltd.; LD-5015iCW; NA=0.50), then subjected to heat treatment on a hot plate at 100° C. for 90 seconds. This wafer was puddle-developed for 1 minute at 23° C. using an alkaline developer, AZ 300MIF developer ("AZ" is a registered trade name; 2.38 wt % aqueous solution of tetramethylammonium hydroxide), made by Clariant Japan K.K. to obtain a negative pattern.

Cross-sectional form of the thus obtained negative pattern was observed under a scanning electron microscope S-4000 (made by Hitachi, Ltd.) to obtain the results tabulated in Table 1.

| Negative-working photoresist | |
|---|---|
| Polyhydroxystyrene | 27 parts by weight |
| Methoxymethylated urea resin | 4.5 parts by weight |
| 2-(p-methoxyphenyl)-4,6-bis-(trichloromethyl)-1,3,5-triazine | 9 parts by weight |
| Propylene glycol monomethyl ether acetate | 59.5 parts by weight |

EXAMPLE 2 to 4

Procedures described in Example 1 were conducted except for changing the mixing ratio of polyacrylic acid and polyvinyl pyrrolidone as shown in Table 1 to obtain the results tabulated in Table 1.

Comparative Examples 1 to 3

Procedures described in Example 1 were conducted except for changing the mixing ratio of polyacrylic acid and polyvinyl pyrrolidone as shown in Table 1 to obtain the results tabulated in Table 1.

TABLE 1

| | PAA*:PVP** | Form of pattern |
|---|---|---|
| Example 1 | 90:10 | rectangular |
| Example 2 | 99:1 | almost rectangular |
| Example 3 | 70:30 | rectangular |
| Example 4 | 50:50 | almost rectangular |
| Comparative Example 1 | 100:0 | slightly round-topped |

TABLE 1-continued

|  | PAA*:PVP** | Form of pattern |
|---|---|---|
| Comparative Example 2 | 30:70 | weakly round-topped |
| Comparative Example 3 | 0:100 | strongly round-topped |

*polyacrylic acid
**polyvinyl pyrrolidone

EXAMPLE 5

A positive-working photoresist of the following formulation was coated on an HMDS-treated, 4-inch silicon wafer using a spin coater, LARC ULTIMA-1000 made by Lithotec Japan Co. and prebaked at 900° C. for 60 seconds on a hot plate to form a 0.7 μm thick resist layer. Thickness of the resist layer was measured by means of a LAMBDA ACE film thickness-measuring apparatus made by Dai-nippon Screen Co., Ltd. Then, the anti-reflective coating composition used in Example 1 was coated on the photoresist layer using the same spin coater as described above and was prebaked at 90° C. for 60 seconds to form a 430-Å thick anti-reflective coating. This, silicon wafer was exposed through reticle patterns of various line-and-space sizes with stepwise changing the exposure amount using a stepper having an exposing wavelength of 248 nm (made by Canon Co., Ltd.; NA=0.63), then subjected to heat treatment on a hot plate at 110° C. for 90 seconds. This wafer was puddle-developed for 1 minute at 23° C. using an alkaline developer, AZ 300MIF developer (2.38 wt % aqueous solution of tetramethylammonium hydroxide) made by Clariant Japan K.K. to obtain a positive pattern.

Cross-sectional form of the thus obtained positive pattern was observed under a scanning electron microscope S-4000 (made by Hitachi, Ltd.) to obtain the results tabulated in Table 2.

| Positive-working photoresist | |
|---|---|
| Copolymer between 4-hydroxystyrene and 4-t-butyloxycarbonylstyrene | 12.57 parts by weight |
| Triphenylsulfonium trifluoromethane-sulfonate | 0.4 part by weight |
| Tetramethylammonium hydroxide | 0.03 part by weight |
| Propylene glycol monomethyl ether acetate | 87 parts by weight |

EXAMPLE 6 to 8

Procedures described in Example 5 were conducted except for changing the mixing ratio of polyacrylic acid and polyvinyl pyrrolidone as shown in Table 2 to obtain the results tabulated in Table 2.

Comparative Examples 4 to 6

Procedures described in Example 5 were conducted except for changing the mixing ratio of polyacrylic acid and polyvinyl pyrrolidone as shown in Table 2 to obtain the results tabulated in Table 2.

TABLE 2

|  | PAA*:PVP** | Form of pattern |
|---|---|---|
| Example 5 | 90:10 | rectangular |
| Example 6 | 99:1 | almost rectangular |
| Example 7 | 70:30 | rectangular |
| Example 8 | 50:50 | almost rectangular |
| Comparative Example 4 | 100:0 | slightly T-topped |
| Comparative Example 5 | 30:70 | weakly T-topped |
| Comparative Example 6 | 0:100 | strongly T-topped |

*polyacrylic acid
**polyvinyl pyrrolidone

As is apparent from Tables 1 and 2 shown above, it is seen that combined use of water-soluble resins of polyacrylic acid and polyvinyl pyrrolidone in the anti-reflective coating composition serves to improve the form of a resist pattern irrespective of whether the photoresist on which the coating composition is applied is positive-working or negative-working and, further, that the form of a resist pattern to be formed can be markedly improved by selecting the mixing ratio of the two resins in a particular range.

Advantages of the invention

As has been described hereinbefore, the anti-reflective coating composition of the present invention enables one to obtain a highly resolved resist pattern having no deterioration of pattern form, such as T-top with respect to chemically amplified positive-working resist or round top with respect to negative-working resist, which is to be caused by intermixing of the coating composition with the resist.

INDUSTRIAL UTILITY

The anti-reflective coating composition of the present invention is useful as an anti-reflective coating composition for preventing reflection at the upper surface of a photoresist upon manufacturing semiconductor elements such as LSI.

What is claimed is:

1. An anti-reflective coating composition comprising at least:
   (a) polyacrylic acid;
   (b) polyvinyl pyrrolidone;
   (c) $C_nF_{2n+1}COOH$ (n is an integer of 3 to 11); and
   (d) tetramethylammonium hydroxide, wherein the proportion of polyacrylic acid:polyvinyl pyrrolidone ranges from 99.5:0.5 to 50:50 (ratio by weight).

2. The anti-reflective coating composition according to claim 1, wherein the solvent in the anti-reflective coating composition is water.

3. A method of forming a resist pattern, which comprises applying the anti-reflective coating composition described in claim 1 onto a photoresist layer.

4. An anti-reflective coating composition comprising at least:
   (a) polyacrylic acid;
   (b) polyvinyl pyrrolidone;
   (c) $C_nF_{2n+1}COOH$ (n is an integer of 3 to 11); and
   (d) tetramethylammonium hydroxide, wherein the proportion of said components (a), (b), (c) and (d) is [(a)+(b)]:(c):(d)=1.0:1.0–7.0:0.1–1.0 (ratio by weight).

5. The anti-reflective coating composition according to claim 4, wherein the solvent in the anti-reflective coating composition is water.

6. A method of forming a resist pattern, which comprises applying the anti-reflective coating composition described in claim 4 onto a photoresist layer.

* * * * *